(12) United States Patent
Gundlach et al.

(10) Patent No.: US 10,550,951 B2
(45) Date of Patent: Feb. 4, 2020

(54) ACTUATOR WITH BRUSHLESS DC MOTOR

(71) Applicant: AIRBUS OPERATIONS LIMITED, Bristol (GB)

(72) Inventors: Till Gundlach, Bristol (GB); Kayvon Barad, Bristol (GB); Osama Al-Tayawe, Bristol (GB); Geoff Ward, Bristol (GB); Andrew Stewart, Bristol (GB); Christopher Lewis, Bristol (GB)

(73) Assignee: Airbus Operations Limited, Bristol (GB)

( * ) Notice: Subject to any disclaimer, the term of this patent is extended or adjusted under 35 U.S.C. 154(b) by 0 days.

(21) Appl. No.: 15/801,721

(22) Filed: Nov. 2, 2017

(65) Prior Publication Data
US 2018/0135772 A1    May 17, 2018

(30) Foreign Application Priority Data
Nov. 7, 2016  (GB) .................................... 1618759.3

(51) Int. Cl.
| | | |
|---|---|---|
| F16K 31/04 | (2006.01) | |
| B64C 17/10 | (2006.01) | |
| H02K 11/215 | (2016.01) | |
| F16K 5/06 | (2006.01) | |
| H02K 7/116 | (2006.01) | |
| H02K 11/30 | (2016.01) | |
| F16K 37/00 | (2006.01) | |

(Continued)

(52) U.S. Cl.
CPC ............ *F16K 31/042* (2013.01); *B64C 17/10* (2013.01); *B64D 37/005* (2013.01); *B64D 37/12* (2013.01); *F16K 5/06* (2013.01); *F16K 31/043* (2013.01); *F16K 31/046* (2013.01); *F16K 37/0008* (2013.01); *F16K 37/0016* (2013.01); *F16K 37/0033* (2013.01); *F16K 37/0041* (2013.01); *F16K 37/0083* (2013.01); *G01R 33/072* (2013.01); *H02K 7/1166* (2013.01); *H02K 11/215* (2016.01); *H02K 11/30* (2016.01); *B64D 37/04* (2013.01); *Y10T 137/8242* (2015.04); *Y10T 137/8275* (2015.04); *Y10T 137/8292* (2015.04)

(58) Field of Classification Search
CPC .... F16K 31/043; F16K 31/046; F16K 31/042; F16K 37/0083; F16K 37/0008; F16K 37/0016; Y10T 137/8242; Y10T 137/8275; Y10T 137/8292; G01R 33/072; B64C 17/10; B64D 37/12; H02K 7/1166; H02K 29/08
See application file for complete search history.

(56) References Cited

U.S. PATENT DOCUMENTS

| | | | |
|---|---|---|---|
| 4,647,003 A | * | 3/1987 | Hilpert ................ F16K 31/1635 137/554 |
| 7,266,020 B1 | | 9/2007 | Trimberger |

(Continued)

OTHER PUBLICATIONS

Combined Search and Examination Report for GB1618759.3, dated May 9, 2017, 6 pages.

*Primary Examiner* — Atif H Chaudry
(74) *Attorney, Agent, or Firm* — Nixon & Vanderhye P.C.

(57) ABSTRACT

An actuator includes a brushless DC motor, an output device, a reduction system coupled between the brushless DC motor and the output device, and a contactless position sensor configured to sense a position of the output device.

17 Claims, 3 Drawing Sheets

(51) Int. Cl.
  *G01R 33/07* (2006.01)
  *B64D 37/12* (2006.01)
  *B64D 37/04* (2006.01)
  *B64D 37/00* (2006.01)

(56) References Cited

U.S. PATENT DOCUMENTS

| | | | | |
|---|---|---|---|---|
| 2002/0056601 | A1* | 5/2002 | Inoue | B60W 30/18 |
| | | | | 192/3.62 |
| 2005/0193977 | A1* | 9/2005 | Hata | F02D 11/105 |
| | | | | 123/350 |
| 2005/0258786 | A1 | 11/2005 | Kellogg et al. | |
| 2007/0084511 | A1* | 4/2007 | Johnson | B64C 17/10 |
| | | | | 137/265 |
| 2008/0054830 | A1* | 3/2008 | Kausch | H02P 6/16 |
| | | | | 318/268 |
| 2009/0108220 | A1* | 4/2009 | Staev | F16K 31/04 |
| | | | | 251/129.12 |
| 2009/0277519 | A1* | 11/2009 | Parker | F15B 19/002 |
| | | | | 137/625.65 |
| 2009/0293615 | A1* | 12/2009 | Lee | G01P 1/127 |
| | | | | 73/514.01 |
| 2013/0134334 | A1 | 5/2013 | Denat et al. | |
| 2014/0076083 | A1* | 3/2014 | Hamamoto | B23K 11/16 |
| | | | | 74/434 |
| 2015/0075652 | A1* | 3/2015 | Bell | F16K 37/0008 |
| | | | | 137/556 |
| 2016/0122004 | A1 | 5/2016 | Ribarov et al. | |
| 2017/0359196 | A1* | 12/2017 | Evert | G06F 21/85 |

\* cited by examiner

ACTUATOR WITH BRUSHLESS DC MOTOR

RELATED APPLICATION

This application claims priority to United Kingdom Patent Application GB 1618759.3 filed Nov. 7, 2016, the entire contents of each of which is hereby incorporated by reference.

FIELD OF THE INVENTION

The present invention relates to an actuator with a brushless DC motor.

BACKGROUND OF THE INVENTION

Current actuators for driving aircraft components, such as rotary valves, comprise a brushed DC motor driving the actuator's output shaft via a gearbox.

SUMMARY OF THE INVENTION

A first aspect of the invention provides an actuator comprising a brushless DC motor, an output device, a reduction system coupled between the brushless motor and the output device, and a contactless position sensor for sensing a position of the output device.

The invention is advantageous in that it enables fully closed loop control of the position, velocity and acceleration of the output device.

Optionally the position of the output device, as sensed by the contactless position sensor, is used in fully closed loop to electronically commutate the brushless DC motor.

The output device may be a rotary output device of a rotary actuator. Alternatively, the output device may be a linear output device of a linear actuator, or any other type of output device for an actuator.

The contactless position sensor may include a Hall Effect sensor. Alternatively the contactless position sensor may use any other non-contact method, e.g. an optical encoder. The contactless position sensor may be arranged to directly measure a position of the output device. The direct or 'deterministic' method may be used in preference to methods that determine position at the start and end of travel, or sensor-less methods that infer position of the output device from measurement of back EMF.

The actuator may further comprise an electronic controller coupled to the contactless position sensor and to the BLDC motor. The controller may be configured to produce an electric drive signal for commutating windings of the BLDC motor based upon a sensor signal from the contactless position sensor.

To provide electronic commutation of the BLDC motor, the controller needs to determine the position of the output device and modulate power to the appropriate motor windings. Semi-conductors can achieve the high speed switching required with no mechanical wear. The controller may therefore include one or more of: a microcontroller, a field programmable gate array (FPGA), or an application-specific integrated circuit (ASIC). The controller may include multiple redundant modules within the same controller, each module having control and voting components. In aerospace applications, FPGA or ASIC may be preferred over a microcontroller due to certification requirements. ASIC, although generally more expensive than FPGA for small production runs, is generally better at coping with the ionising environment experienced at high altitude.

The controller may include a proportional-integral-derivative (PID) controller for controlling motor torque and motor speed. The PID controller may be implemented in hardware.

The controller may be partitioned at least two sections. For example, an FPGA controller so partitioned may have different FPGA sections configured to operate at different Design Assurance Levels on the same FPGA.

The actuator may further comprise a storage device for storing one or more parameters of the actuator. The actuator parameters may include, for example, current, voltage, motor speed or data relating to a signal from the contactless position sensor. The storage device may be coupled to the controller, or alternatively the storage device may form part of the controller. Where the storage device forms part of the controller, data gathering and storage functions of the controller may be partitioned within the controller from the actuator control hardware. The storage device may include non-volatile memory.

The controller may be configured to sample and store one or more parameters of the actuator at a variable rate in dependence upon one or more events. For example, the controller may be configured to sample and store one or more parameters of the actuator at a high sample rate in the event of a short lived electrical transient during active operation of the motor, and at a low sample rate in the event of standby operation of the motor.

The storage device may be coupled to an interface for retrieving data from the storage device. The interface may be temporarily connected to a reader, or alternatively the interface may be permanently connected to a monitoring system.

A further aspect of the invention provides a valve assembly including the actuator according to the first aspect. The output device may be a rotary output device coupled to a valve of the valve assembly, and the actuator may be arranged to open and close the valve.

The actuator may further comprise an electrical connector for receiving a valve position command signal. The controller may be configured to determine the actual valve position and to compare the actual valve position against the valve command signal and to correct any mismatch by driving the motor.

The electrical connector may include two command discrete pins, where energising one pin drives the valve to an open position, and energising the other pin drives the valve to a closed position. The controller may be arranged to continuously provide a discrete electrical signal to the two command discrete pins to indicate the state of the valve irrespective of whether the actuator is powered.

The valve may include a ball valve.

A further aspect of the invention provides an aircraft fuel system including the valve assembly according to the above aspect of the invention, wherein the valve assembly is coupled in a conduit of the aircraft fuel system.

A yet further aspect of the invention provides an aircraft including the aircraft fuel system of the above aspect of the invention.

BRIEF DESCRIPTION OF THE DRAWINGS

Embodiments of the invention will now be described with reference to the accompanying drawings, in which.

DETAILED DESCRIPTION OF EMBODIMENT(S)

Figure 1:
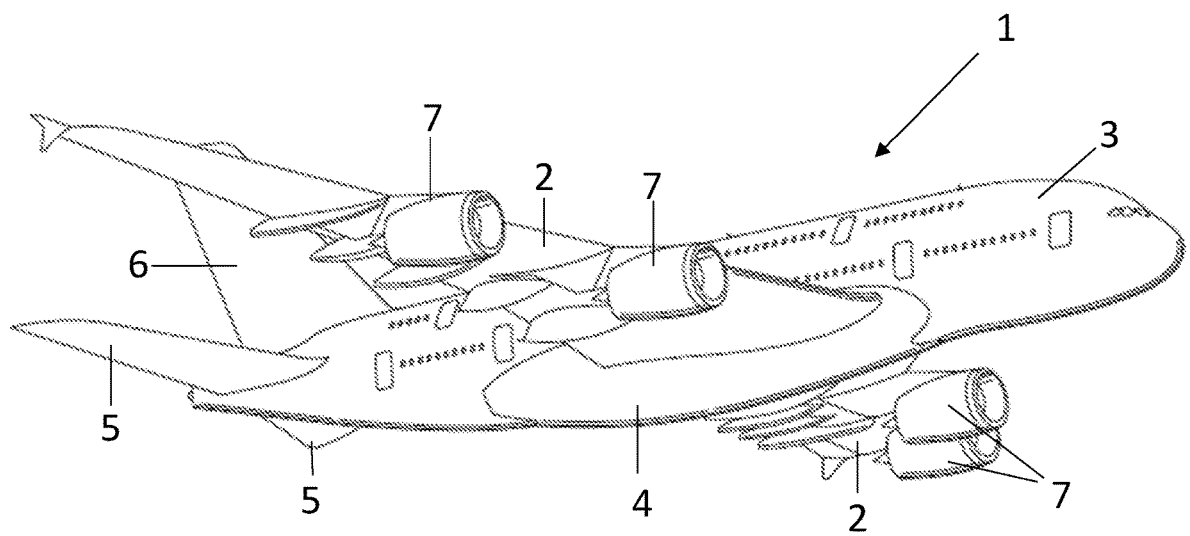
FIG. 1 illustrates an aircraft.

FIG. 1 illustrates an aircraft 1 including a main wing 2, fuselage 3, belly-fairing 4, horizontal tail plane 5 and vertical tail plane 6. As is a common feature of many fixed wing aircraft, the main wing 2 has an internal volume arranged as one or more fuel tanks for carrying liquid fuel to be consumed by the aircraft's main engines 7.

Figure 2:
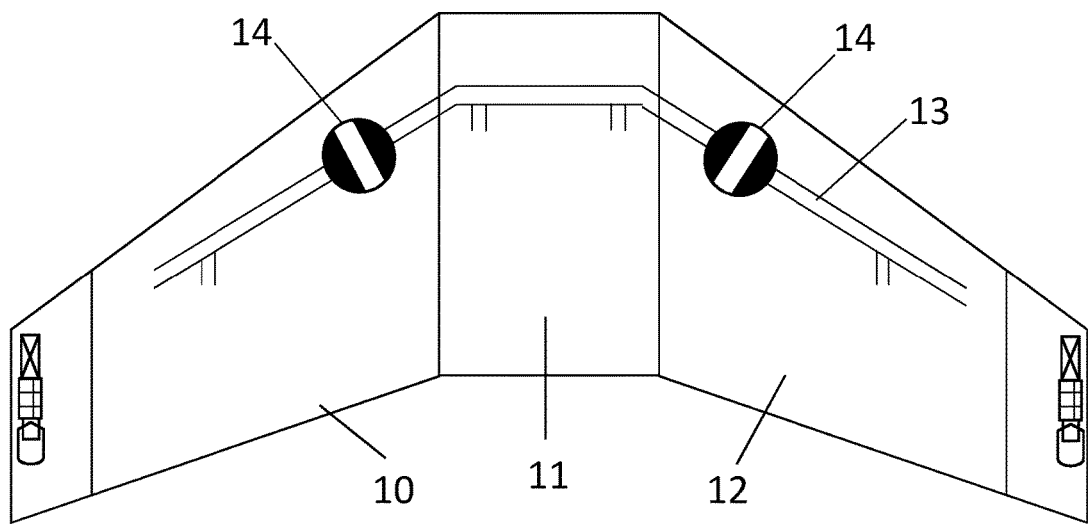
FIG. 2 illustrates a schematic diagram of part of a fuel system for the aircraft.

FIG. 2 illustrates a schematic diagram of fuel tanks in the main wing 2. The fuel tanks are partitioned as a left wing tank 10, a centre wing tank 11 and a right wing tank 12. The illustration in FIG. 2 is purely exemplary and in other configurations the fuel tanks may be arranged with a greater or fewer number of tanks. For example, the left, right or centre wing tanks may comprise a plurality of wing tanks, and the horizontal tail plane 5 may have an internal volume used to provide further fuel tanks, generally known as trim tanks.

As illustrated in FIG. 2, the fuel tanks are fluidly connected to a crossfeed manifold 13. The crossfeed manifold 13 is used to transfer fuel from one of the fuel tanks 10-12 to another of the fuel tanks 10-12 when required. Crossfeed of fuel between the fuel tanks may be required for various reasons, e.g. to maintain aircraft balance (lateral or longitudinal) within a centre of gravity operating range of the aircraft 1 or in case of emergency. To permit a flow of fuel through the crossfeed manifold 13, crossfeed valves 14 is provided. Opening one or more of the crossfeed valves 14 permits flow of fuel along the crossfeed manifold 13 and closing the crossfeed valve 14 prevents flow of fuel through the crossfeed manifold 13.

Figure 3:
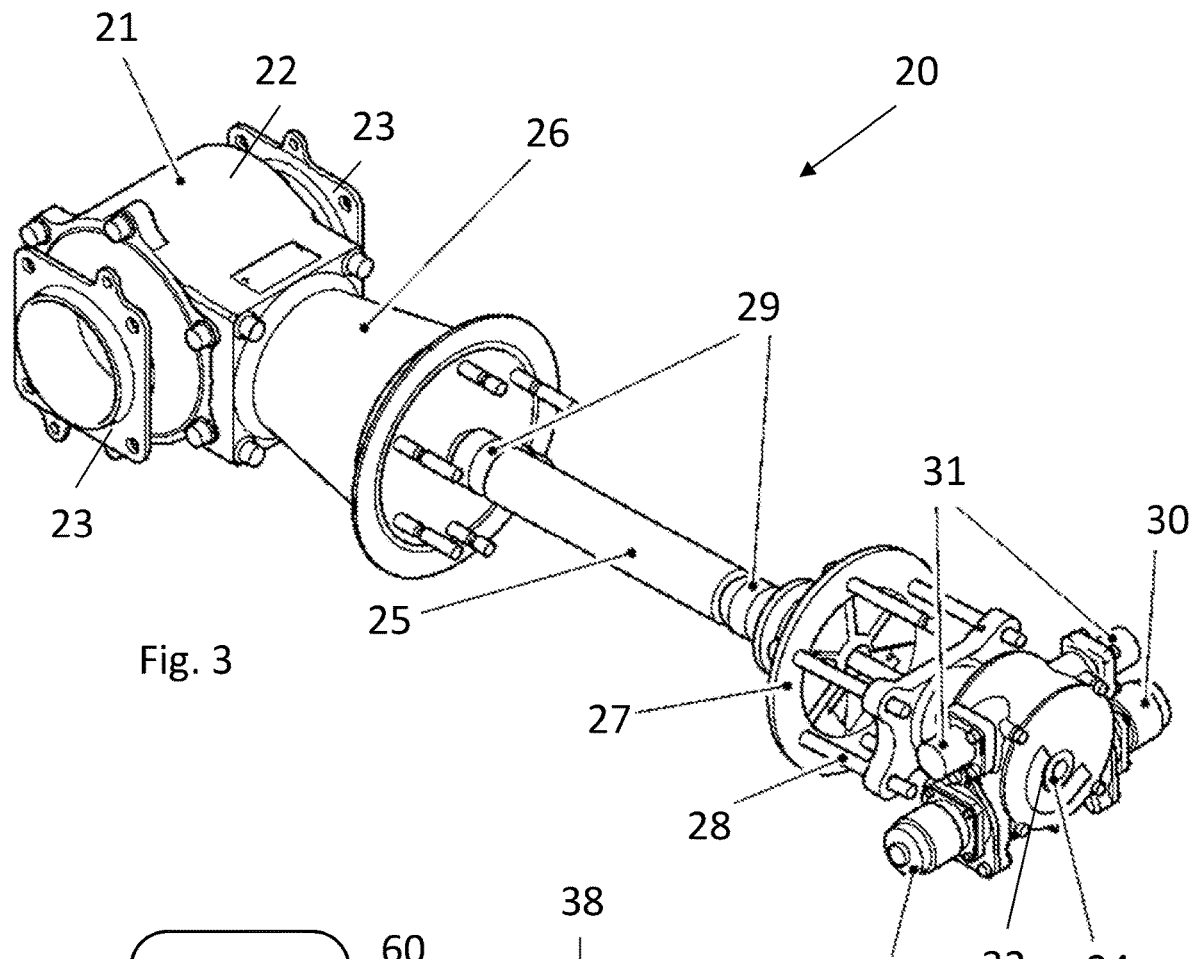
FIG. 3 illustrates a valve assembly including a ball valve and a rotary actuator including a BLDC motor.

FIG. 3 illustrates a valve assembly 20. The valve assembly 20 comprises a ball valve 21 having a valve body 22 coupled to mounting flanges 23 for coupling to the crossfeed manifold 13 on either side of the valve body 22. A ball valve is a form of quarter turn valve which has a pivoting ball to control flow of fluid through the valve. The ball has a through hole and operates such that the valve is open when the ball's hole is in line with the flow and closed when the ball's hole is pivoted 90 degrees to the flow direction. Rotation of the ball is effected by a rotary actuator 24.

The rotary actuator 24 has a rotary output shaft coupled to the ball of the ball valve by a drive shaft 25. The valve body 22 is mounted to other aircraft components via a pedestal 26 and likewise the actuator 24 is mounted to other aircraft components via a mounting flange 27 and actuator attachments 28. The drive shaft 25 has universal joints 29 at either end.

In the particular embodiment illustrated in FIG. 3, the actuator 24 is a twin motor actuator and includes a pair of electric motors 30 and a corresponding pair of electrical connectors 31. However, it will be appreciated that the actuator 24 may have only a single motor and electrical connector, or may have a number of motors and electrical connectors greater than two.

It is important that the position of the valve (i.e. open or closed) can be visibly checked. Since in the illustrated embodiment the valve is a ball valve where the ball component is hidden from view within the valve body 22 when coupled to the crossfeed manifold 13, the position of the valve can be determined from the position of the actuator. Accordingly, the actuator 24 has an indicator 32 coupled in rotation to the rotary output device of the actuator 24, which directly corresponds to the angular position of the ball of the ball valve 21. The indicator 32 may therefore be used to visibly determine the status of the valve.

Figure 4:
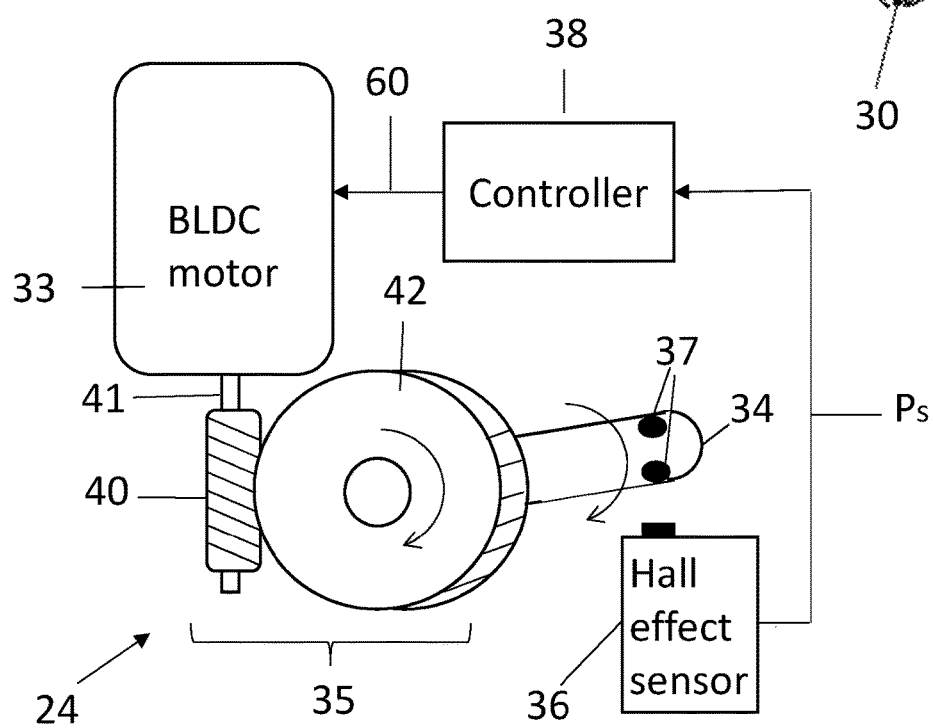
FIG. 4 illustrates a schematic diagram of the closed loop control of the BLDC motor.

FIG. 4 illustrates a schematic diagram of the main components of the actuator 24, which include a BLDC motor 33, a rotary output device 34, a reduction system 35 coupled between the BLDC motor 33 and the rotary output device 34 and a contactless position sensor for sensing a position of the rotary output device 34.

In the illustrated embodiment the contactless position sensor is a Hall Effect sensor 36 arranged to sense the position of the rotary output device 34 by detecting the magnetic field of two magnets 37 mounted on the rotary output device 34. The magnets may be provided on a cam attached to revolve with the rotary output device. An output signal, Ps, of the Hall Effect sensor 36 is input to a controller 38 which is configured to produce an electronic drive signal for commutating windings of the BLDC motor 33 based upon the signal from the Hall Effect sensor 36. The controller 38 therefore provides fully closed loop electronic control of the BLDC motor 33 based upon the position of the rotary output device motor 34. Alternative contactless position sensors may use other Hall Effect sensing arrangements with one or more magnets, or other magnetic or optical encoders for example.

In the illustrated embodiment the reduction system 35 includes a mechanical gear arrangement including a worm gear 40 coupled in rotation to the motor output shaft 41. The worm gear 40 engages with a toothed gear 42 coupled in rotation to the actuator output device 34. The reduction system 35 therefore provides torque increase and rotational velocity decrease to the actuator output device 34 as compared with the motor output shaft 41.

It will be appreciated that the worm gear reduction system illustrated in FIG. 4 is purely exemplary and a greater or fewer number of mechanical gears may be provided in the reduction system so as to achieve the torque increase and speed decrease to the rotary output device 34. A variety of spur gear, worm gear or epicyclic gear reduction systems may be used.

Furthermore, it will be appreciated that whilst in the embodiment illustrated in FIG. 4, the output device is a rotary output device 34, the actuator output device may alternatively be a linear output device. For example, the BLDC motor 33 may be used to drive a hydraulic pump which provides fluid pressure to a hydraulic cylinder for moving a piston along the cylinder where the piston is coupled to a linear output device of an electro-hydraulic actuator. In such an actuator, the hydraulic parts of the system provide the reduction system for reducing the speed of motion of the output device as compared with the speed of the motor, accompanied by a torque increase.

As compared with the brushed BLDC motors used in the prior art for driving aircraft components, such as rotary valves, BLDC motors do not require brushes and instead achieve commutation with solid state electronics. BLDC motors therefore avoid the problem of wear or fouling of electromechanical contacts found in brushed DC motors. The resultant omission of electrical arcing within the motor results in lower electromechanical interference and the removal of an ignition source. Full encapsulation of the windings within the BLDC motor is possible, reducing the number of exposed conductive elements which may short-circuit. In BLDC motors, the windings are part of the stator and are in thermal contact with the motor casing which provides superior heat dissipation as compared with a brushed DC motor where the windings are part of the rotor. As a consequence, BLDC motors can be run at higher power and may be smaller. BLDC motors exhibit improved durability and reduced moisture sensitivity as compared with brushed DC motors.

The ball valve 21 may be susceptible to icing at the extremely cold temperatures which may be experienced in the aircraft, e.g. during flight at high altitude and/or cold climates. The BLDC motor 33, which can provide more power output for the same electrical input as the prior art brushed DC motors, is better able to transmit a higher torque to the rotating ball in the ball valve 21 to overcome any build-up of ice. Therefore, the actuator 24 including the BLDC motor 33 can be used as a direct retrofittable replacement for a valve actuator based on brushed DC motor technology in the valve assembly 20 without changing any of the other components of the valve assembly and whilst maintaining the same electrical connections to the aircraft power supply.

The reduction system 35 is important, particularly in the aircraft environment, as the aircraft power supply is generally limited and so the speed of the BLDC motor 33 must be kept relatively high in order to keep current down to within the aircraft power supply limits. However, it is also important that the movement of the actuator output device 34 is relatively slow (approximately 2.5 seconds to move the quarter turn ball valve 21) as opening and closing the valve too quickly can cause a pressure surge within the crossfeed manifold 13 which may cause damage to components of the aircraft's fuel system—so called hydraulic shock.

To commutate the magnetic field of the windings in the BLDC motor 33, the controller 38 is required to determine the position of the motor's rotor and modulate power to the appropriate windings. There are multiple devices which can achieve this type of control including microcontrollers, FPGAs and ASICs for example.

Figure 5:
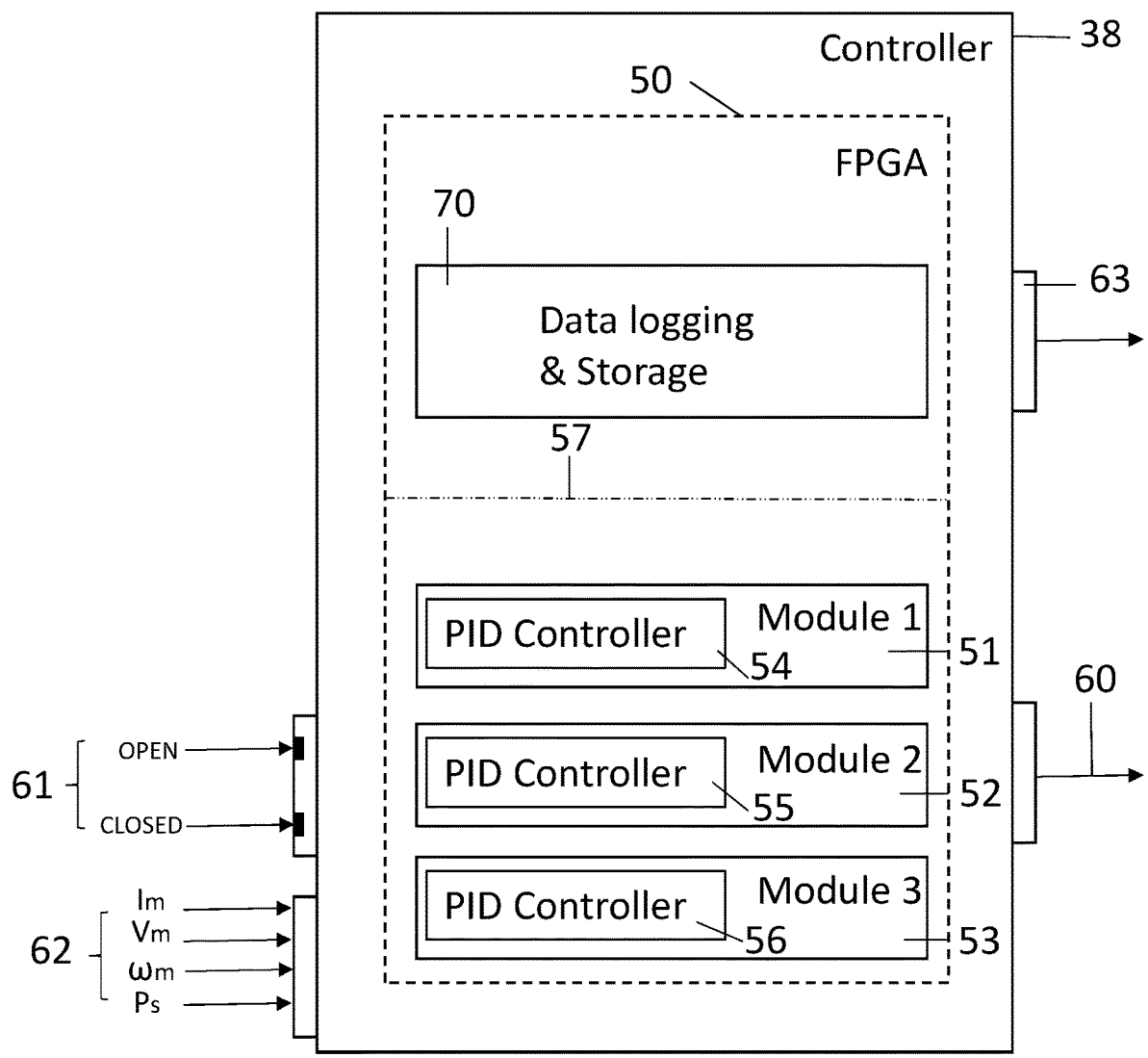
FIG. 5 illustrates a schematic diagram of the actuator controller.

FIG. 5 illustrates an exemplary controller 38 which includes an FPGA 50. The FPGA includes triple module redundancy that triplicates control and voting components within the same FPGA. This triple redundancy is designed to minimise the detrimental effects of single event upsets (SEU) caused by atmospheric radiation. Atmospheric radiation may affect aircraft electronics, particularly during flight at cruise altitudes. The FPGA 50 therefore includes three modules 51, 52, 53 each comprising a PID controller 54, 55, 56. The PID controllers are configured for torque and speed control of the BLDC motor 33 and are implemented in hardware. Implementing the PID controllers in hardware makes them processor independent and therefore faster than micro-processor based methods. The triple module redundancy architecture is expected to be tolerant of single event latchup (SEL) on a single channel.

The controller 38 outputs the electric drive signal 60 to commutate the windings of the BLDC motor based upon commanded states and current states, and commands the actuator 24 within a pre-defined set of rules. The actuator controller 38 has a command input 61 defining a valve open and a valve closed position. The current states are input to the controller 38 as a set of key electrical parameters of the current states 61, including motor current, Im; motor voltage, Vm; motor speed, $\omega$m; and the signal, Ps, from the contactless position sensor. The controller 38 provides adaptable torque and speed control of the motor, and may incorporate built in test equipment (BITE).

In addition to the hardware used to control the actuator's primary functions, the actuator electronics includes a data logging and storage functionality. As shown in FIG. 5, data logging and storage 70 is performed by the same controller 38, and indeed is performed on the same FPGA 50 as the hardware used to control the actuator's primary functions. It will be appreciated that the data logging and storage 70 may be provided separate from the controller 38, or may be provided within the same controller as the hardware used to control the actuator's primary functions but separate from FPGA 50.

The data logging and storage 70 provides the ability to self-test and log parameters, which is a key benefit of the digital electronic architecture over analogue control methods. The self-test/logging provides the ability to record performance which enables health and wear-out to be monitored over time, and improved trouble-shooting. This data may be used for predictive maintenance of the actuator 24 or other components of the valve assembly 20.

Although the data logging and storage 70 is performed on the same FPGA 50 as the hardware used to control the actuator's primary functions, an FPGA partition 57 is in place. The partition 57 enables lower design assurance level processes to be included on the same FPGA 50 behind the partition such that the data logging and storage 70 has a lower design assurance level as compared with the hardware used to control the actuator's primary functions. Separating the data logging and storage 70 from the control hardware with the partition prevents failure in a non-essential function propagating to essential functions. Integration of the logging hardware/software in this manner minimises the number of parts in the devices that are specific to data gathering and storage. The data logging and storage may include a non-volatile memory which can interface with a connector 63 to allow data to be retrieved from the storage device.

The data logging and storage 70 is configured to sample and store key parameters of the actuator at a variable rate in dependence upon one or more events. For example, the controller may be configured to sample and store key parameters of the actuator at a high sample rate in the event of a short lived electrical transient during active operation of the motor, and a low sample rate in the event of standby operation of the motor. Switching between the sample rates is triggered by a change of command state, e.g. open or closed, at the command inputs 61.

Using the interface connector 63, data stored in the storage device as part of the data logging and storage 70 may be retrieved from the actuator 24 for subsequent analysis. Alternatively, the interface connector 63 may be connected via a data link to a central predictive maintenance component on board the aircraft which retrieves predictive maintenance and data from a variety of aircraft components. The amount of data required to be stored by the data logging and storage 70 may be varied accordingly.

Returning to FIG. 3, which illustrates the electrical connectors 31 of the actuator 24, these electrical connectors include two command discreet pins via which all power for the actuator 24 is drawn when connected to the aircraft power supply. Each of these pins is normally provided with +28 VDC and the command state of the actuator is set by which of the two pins are energised: one pin is energised to command the actuator to close, the other to open. The actuator's controller 38 monitors the valve state, which may be open, closed or an intermediate value and compares against the command state. Any mismatch between the command and valve state is corrected by driving the motor in the relevant direction. The electronics in the actuator that monitor the valve state continuously provide a discrete electric signal to two pins in the electric connectors 31.

These signals are used to determine if the valve is open or closed. One pin signals that the valve is open and the other signals that the valve is closed. Logical "true" to either state is represented by an electrical "ground" condition on the pin; logical "false" is represented by an electrical "open" circuit on either of the pins. These signals are continuous and indicate the state of the valve irrespective of whether the actuator is powered.

Although in the exemplary embodiments described above, the actuator is coupled to a rotary valve of a crossfeed valve, it will be appreciated that the invention has wider applications both in aircraft and non-aircraft applications. For example, the rotary valve actuator may be used to drive other aircraft fuel valve assemblies, such as a refuel valve, a fuel inlet valve, transfer or defuel valve; other fluid valves on board the aircraft separate from the fuel system; flight control system actuators for moving flight control surfaces; or other types of linear and rotary actuators for a wide variety of functions. Advantageously, an interface adaptor may be provided on the actuator to provide a common drive a control to achieve economies of scale for a variety of different actuator applications.

Although the invention has been described above with reference to one or more preferred embodiments, it will be appreciated that various changes or modifications may be made without departing from the scope of the invention as defined in the appended claims.

The invention claimed is:

1. An aircraft fuel system comprising:
a plurality of fuel tanks fluidly connected to a crossfeed manifold;
a valve configured to regulate fuel transfer between the fuel tanks through the crossfeed manifold;
an actuator for the valve, the actuator comprising:
a brushless DC motor,
a rotary output device including a disc drive gear configured to turn the valve between open and closed positions,
a reduction system driven by the brushless DC motor and engaging the disc drive gear to turn the disc drive gear and thereby turn the valve;
a housing enclosing the reduction system, wherein the housing includes a front plate and a back plate and a sidewall between the front plate and the back plate;
a shaft coupling the disc drive gear to the valve extends through the front plate of the housing;
a contactless position sensor configured to sense a rotational position of the rotary output device,
an indicator on the disc drive gear which is visible through a window in the back plate of the housing when viewed from outside of the actuator, wherein the indicator indicates a rotational position of the drive shaft;
an electronic controller coupled to the contactless position sensor and to the brushless DC motor, wherein the electronic controller is configured to produce an electric drive signal for commutating windings of the brushless DC motor based upon a sensor signal from the contactless position sensor;
an electrical connector for receiving a valve position command signal, wherein the electrical connector includes two command discrete pins, and energising one of the two command discrete pins drives the valve to an open position, and energising the other of the two command discrete pins drives the valve to a closed position, wherein the electronic controller is arranged to continuously provide a discrete electrical signal to the two command discrete pins to indicate the state of the valve irrespective of whether the actuator is powered;
wherein the brushless DC motor is a first brushless DC motor and is mounted to the sidewall of the housing, and the actuator further comprises a second brushless DC motor mounted to the sidewall opposite to the first brushless DC brushless motor, wherein both the first and second brushless DC motors are configured to drive the reduction system;
and wherein the electrical connector is a first electrical connector and is mounted to the sidewall of the housing and parallel to the first brushless DC motor, and the actuator further comprises a second electrical connector mounted to the sidewall opposite to the first electrical connector and parallel to the second brushless DC motor.

2. The aircraft fuel system according to claim 1, wherein the reduction system includes a worm gear driven by the brushless DC motor, wherein the worm gear engages the disc drive gear.

3. The aircraft fuel system according to claim 1, wherein the brushless DC motor is external to the housing.

4. The aircraft fuel system according to claim 1, wherein the contactless position sensor includes a Hall effect sensor, and the Hall effect sensor is arranged to directly measure a rotational position of the rotary output device.

5. The aircraft fuel system according to claim 1, wherein the electronic controller includes one or more of: a microcontroller, an FPGA, or an ASIC.

6. The aircraft fuel system according to claim 1, wherein the electronic controller includes an FPGA having multiple redundant modules within the same FPGA, wherein the redundant modules each include control and voting components.

7. The aircraft fuel system according to claim 1, wherein the electronic controller includes a PID controller implemented in hardware for controlling motor torque and motor speed.

8. The aircraft fuel system according to claim 1, wherein the electronic controller includes an FPGA, wherein the FPGA is partitioned into at least two sections, wherein one of the at least two sections is configured to operate at Design Assurance Level different than a Design Assurance Level at which operates another of the at least two sections.

9. The aircraft fuel system according to claim 1, further comprising a non-transitory storage device configured to store one or more parameters of the actuator, wherein the storage device is coupled to or forms part of the electronic controller.

10. The aircraft fuel system according to claim 9, wherein the storage device forms part of the electronic controller and data gathering and storage functions of the electronic controller are partitioned within the electronic controller from actuator control hardware.

11. The aircraft fuel system according to claim 9, wherein the actuator parameters include one or more of: current, voltage, motor speed or data relating to a signal from the contactless position sensor.

12. The aircraft fuel system according to claim 9, wherein the storage device includes non-volatile memory.

13. The aircraft fuel system according to claim 9, wherein the electronic controller is configured to sample and store one or more parameters of the actuator at a variable rate in dependence upon one or more events.

14. The aircraft fuel system according to claim 13, wherein the electronic controller is configured to sample and store one or more parameters of the actuator at a high sample rate in event of a short lived electrical transient during active operation of the motor, and at a low sample rate in the event of standby operation of the motor.

15. The aircraft fuel system according to claim 9, wherein the storage device is coupled to an interface for retrieving data from the storage device.

16. A valve assembly in combination with an aircraft fuel system;
the aircraft fuel system comprising a cross-feed manifold between fuel tanks in an aircraft;
the valve comprising:
a valve connected to the cross-feed manifold, wherein the valve is configured to be turned to open and close fuel flow through the cross-feed manifold, and
an actuator configured to turn the valve, wherein the actuator includes:
a housing including a front plate, a back pate opposite to the front plate and a sidewall between the front plate and the back plate;
a brushless DC motor mounted to the side wall of the housing;
a rotary output device including a disc gear within the housing, wherein the disc gear is coupled to drive a shaft extending through the front plate of the housing, and the shaft is coupled to the valve such that as the disc gear turns the shaft and valve turn, and the disc gear includes a side facing a window in the back of the housing;
a reduction system within the housing and driven by the brushless DC motor, wherein the reduction system engages an outer rim of the disc gear to turn the disc gear, wherein the reduction system turns the disc gear which turns the shaft and valve to regulate fuel flow,
a contactless position sensor within the housing and configured to sense a position of the disc gear or shaft,
an indicator on the side of the disc gear facing the window in the back plate of the housing, wherein the indicator is visible through the window from outside of the housing, and the indicator indicates a rotational position of the disc gear, the shaft and the valve;
an electronic controller coupled to the contactless position sensor and to the brushless DC motor, and
an electrical connector for receiving a valve position command signal, and
wherein the electronic controller is configured to:
produce an electric drive signal to be applied to commutating windings of the brushless DC motor;
determine an actual valve position based upon a sensor signal from the contactless position sensor,
compare the actual valve position to a valve position indicated by the valve command signal, and
minimize any difference between the actual valve position and the valve position indicated by valve command signal by adjusting the electric drive signal, wherein the electric drive signal actuates the brushless DC motor;
wherein the electrical connector includes two command discrete pins, and energising one of the two command discrete pins drives the valve to an open position, and energising the other of the two command discrete pins drives the valve to a closed position, wherein the electronic controller is arranged to continuously provide a discrete electrical signal to the two command discrete pins to indicate the state of the valve irrespective of whether the actuator is powered;
wherein the brushless DC motor is a first brushless DC motor and is mounted to the sidewall of the housing, and the actuator further comprises a second brushless DC motor mounted to the sidewall opposite to the first brushless DC brushless motor, wherein both the first and second brushless DC motors are configured to drive the reduction system;
and wherein the electrical connector is a first electrical connector and is mounted to the sidewall of the housing and parallel to the first brushless DC motor, and the actuator further comprises a second electrical connector mounted to the sidewall opposite to the first electrical connector and parallel to the second brushless DC motor.

17. The valve assembly according to claim 16, wherein the valve includes a ball valve.

* * * * *